United States Patent [19]

Kobayashi

[11] Patent Number: 5,351,872
[45] Date of Patent: Oct. 4, 1994

[54] DIE BONDING APPARATUS

[75] Inventor: Hiroaki Kobayashi, Yokohama, Japan

[73] Assignee: Kabushiki Kaisha Toshiba, Kanegawa, Japan

[21] Appl. No.: 82,285

[22] Filed: Jun. 24, 1993

[30] Foreign Application Priority Data

Jun. 24, 1992 [JP] Japan ................................. 4-166104

[51] Int. Cl.⁵ ........................................... H01L 21/603
[52] U.S. Cl. ........................................ 228/6.2; 228/9; 228/102
[58] Field of Search ..................... 228/6.2, 9, 10, 102

[56] References Cited

U.S. PATENT DOCUMENTS

| | | |
|---|---|---|
| 4,597,522 | 7/1986 | Kobayashi . |
| 5,060,841 | 10/1991 | Oshima et al. ............... 228/102 |
| 5,078,312 | 1/1992 | Ohashi et al. ................ 228/102 |
| 5,123,585 | 6/1992 | Terakado et al. ............ 228/102 |
| 5,207,370 | 5/1993 | Mochida et al. ............. 228/102 |
| 5,285,946 | 2/1994 | Tomigashi et al. ........... 228/9 |

FOREIGN PATENT DOCUMENTS

| | | |
|---|---|---|
| 62-271537 | 10/1987 | Japan . |
| 315145 | 12/1989 | Japan ......................... 228/6.2 |
| 79047 | 4/1991 | Japan ........................... 228/9 |

*Primary Examiner*—Kenneth J. Ramsey
*Attorney, Agent, or Firm*—Spensley Horn Jubas & Lubitz

[57] ABSTRACT

A die bonding apparatus for bonding a semiconductor die onto a boding surface of a semiconductor lead frame by pressing the semiconductor die under a constant pressure. The apparatus includes a mounting section for mounting the semiconductor die a collet having chucking portion for holding the semiconductor die mounted on the die mounting section, a linear motor for moving the collet up and down, a separating member for separating the semiconductor die from the die mounting section, a horizontal driving section for moving the collet horizontally, a lead frame mounting section for mounting the semiconductor lead frame, a position sensor for detecting vertical positions of the collet and a linear motor control section for controlling vertical travel speed of the collet and bonding pressure of the die against the bonding surface of the semiconductor lead frame, by controllably driving the linear motor on the basis of position information of the collet detected by the position sensor.

10 Claims, 8 Drawing Sheets

DIE BONDING APPARATUS

BACKGROUND OF THE INVENTION

1. Field of the Invention

The present invention relates to a die bonding apparatus.

2. Description of the Prior Art

Conventionally, there has been well known a die bonding apparatus for automatically bonding a semiconductor die onto a bonding surface of a semiconductor lead frame.

A conventional bonding apparatus as disclosed in Japanese Patent Application No. 62-271537 will be described hereinbelow by way of example.

Figure 1:
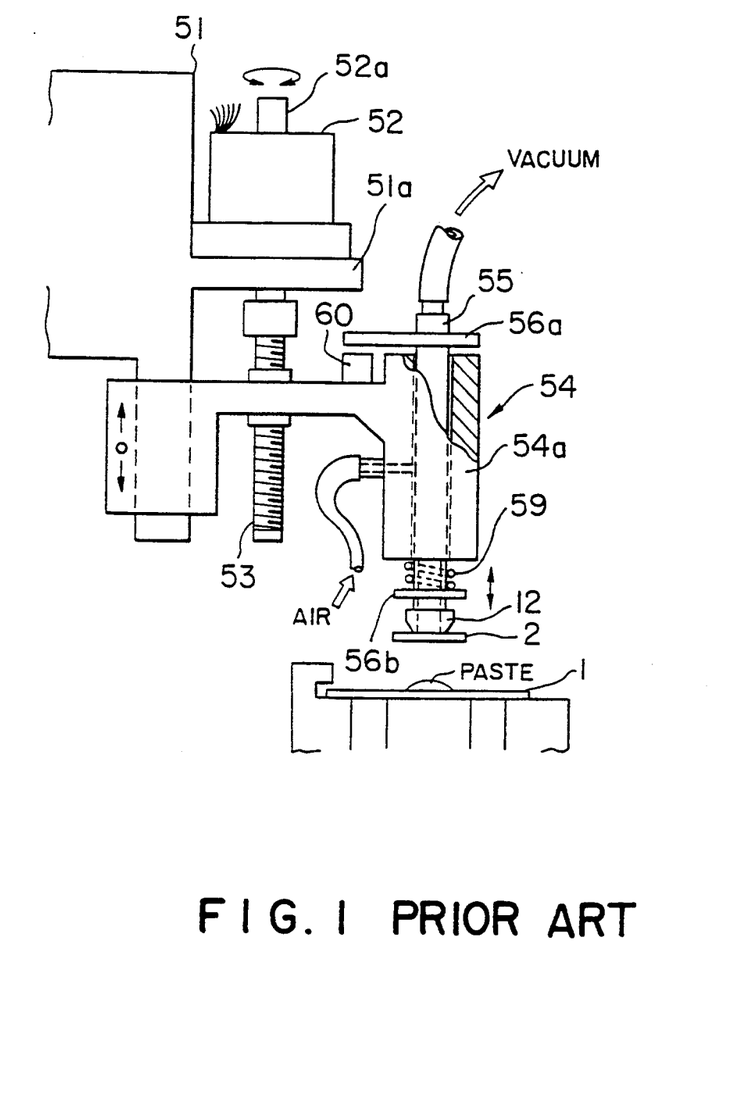
FIG. 1 is a diagrammatical side view showing a conventional die bonding apparatus.

FIG. 1 is a diagrammatical side view showing the above-mentioned conventional die bonding apparatus. In the drawing, a motor 52 is mounted on a base 51a formed at the upper portion of an arm 51. A rotary shaft 52a of this motor 52 is directly connected to a screw 53, and this screw 53 is screwed into a collet head 54. In the construction as described above, when the motor 52 is driven, the collet head 54 can be moved up and down.

Further, a vertical through hole is formed in a body portion 54a of the collet head 54, and a collet shaft 55 is fitted into this through hole so as to be slidable in the vertical direction. A stopper 56a is attached to the collet shaft 55 on the upper portion thereof, and a collet 12 is attached to the collet shaft 55 on the lower portion thereof to suck and support a semiconductor die 2. In addition, a spring support member 56b is provided near the lower portion of the collet shaft 55, and a spring 59 is interposed between the spring support member 56b and the body portion 54a of the collet head 54. In the construction as described above, it is possible to press the semiconductor die 2 onto the semiconductor lead frame 1 under a constant pressure determined by an elastic force of the spring 59 (referred to as bonding pressure, hereinafter), whenever the semiconductor die 2 is bonded onto the semiconductor lead frame 1.

Further, on the upper portion of the collet head 54, a gap sensor 60 is provided to detect the contact between the semiconductor die 2 and the semiconductor lead frame 1. In more detail, when the semiconductor die 2 is not in contact with the semiconductor lead frame 1, since the collet shaft 55 is urged in the downward direction by the spring 59, this gap sensor 60 is in contact with the stopper 56a. On the other hand, when the collet head 54 is lowered for bonding so that the semiconductor die 2 is brought into contact with the semiconductor lead frame 1 and further pressed onto the semiconductor lead frame 1, since the collet shaft 55 is moved in the upward direction relative to the collet head 54, a gap is produced between the gap sensor 60 and the stopper 56a. Accordingly, it is possible to detect the contact between the semiconductor die 2 and the semiconductor lead frame 1. Further, a predetermined bonding pressure can be applied to the semiconductor die 2 by rotating the motor 52 by a predetermined angular stroke after the gap sensor 60 has detected the contract between the semiconductor die 2 and the semiconductor lead frame 1.

In the conventional bonding apparatus as described above, however, there exist the following drawbacks:

(1) The contact between the semiconductor die 2 and the semiconductor lead frame 1 can be detected on the basis of whether the gap sensor 60 is brought into contact with the stopper 56a. In this construction, however, since a gap between the gap sensor 60 and the stopper 56a is produced only after the spring 59 has been compressed to some extent, a detection error occurs inevitably. Further, the inventors have confirmed that this detection error fluctuates according to change in the downward travel speed of the semiconductor die 2 when the semiconductor die 2 is brought into contact with the semiconductor lead frame 1, with the result that it is difficult to compensate for the above-mentioned detection error and thereby the bonding pressure applied to the semiconductor die 2 fluctuates away from a predetermined set value. Further, since this detection error is produced inevitably, it has been substantially impossible to detect whether the thickness of paste used for bonding lies within an allowable thickness range or not, thus deteriorating the production yield of the die bonding process.

(2) In the conventional die bonding apparatus, mechanical parts 55 to 59 must be provided for applying bonding pressure to the semiconductor die 2, in addition to the mechanical parts 51 to 55 for moving the collet 12 up and down as described above. Therefore, the conventional die bonding apparatus involves various shortcomings as follows: the apparatus is complicated in mechanism, large in volume and heavy in weight, and further high in manufacturing cost.

(3) Further, since the weight of the arm 51 is large, the travel speed of the arm 51 is slow when the arm 51 is moved over the semiconductor lead frame 1 after the semiconductor die 2 has been supported by the collet 12, thus causing a difficulty in improvement of the processing capacity (the number of semiconductor dies bonded for each unit time).

(4) Since the apparatus is heavy, the vertical motion of the collet head 54 cannot follow the rotary motion of the motor 52 accurately, with the result that the collet head 54 has been moved excessively or vibrated. Therefore, when the semiconductor die 2 is sucked to by the collet 12 or when the semiconductor die 2 sucked by the collet 12 is brought into contact with the semiconductor lead frame 1, an excessive shock is inevitably applied to the semiconductor die 2, so that there exists a problem in that the semiconductor die 2 may be damaged.

SUMMARY OF THE INVENTION

With these problems in mind, therefore, it is the object of the present invention to provide a die bonding apparatus which can detect the vertical position of the collet (or the vertical position of the die supported by the collet) accurately, and which is simple in mechanism, small in volume and weight, and further low in cost.

To achieve the above-mentioned object, the present invention provides a die bonding apparatus for bonding a die onto a bonding surface of a lead frame by pressing the die under a constant pressure, which comprises: mounting means for mounting the die; a collet having chucking means for holding the die mounted on said die mounting means; a linear motor for moving said collet up and down; separating means for separating the die from said die mounting means when the die mounted on said mounting means is held by said chucking means; horizontal driving means for moving said collet horizontally; lead frame mounting means for mounting the lead frame; a position sensor for detecting vertical positions of said collet; and linear motor control means for controlling vertical travel speed of said collet and bonding pressure of the die against the bonding surface of the lead frame, by controllably driving said linear motor on the basis of position information of said collet detected by said position sensor.

In the die bonding apparatus according to the present invention, the collet can be moved up and down by the linear motor to obtain the die bonding pressure directly, without providing both the mechanism for applying a die bonding pressure and the mechanism for moving the collet up and down as with the case of the conventional apparatus. Accordingly, it is possible to simplify the mechanism of the die bonding apparatus, thus reducing the weight, volume, and cost thereof.

Further, in the die bonding apparatus according to the present invention, the vertical position of the collet can be detected by the position sensor directly. Therefore, it is possible to eliminate the detection error produced by the conventional die bonding apparatus and thereby to reduce the setting error of the bonding pressure. In addition, since the detection error can be reduced sufficiently, it is also possible to detect the thickness of paste used for die bonding with the use of the position sensor, thus further improving the production yield of the die bonding process.

DETAILED DESCRIPTION OF THE PREFERRED EMBODIMENTS

One embodiment of the die bonding apparatus according to the present invention will be described hereinbelow with reference to the attached drawings.

Figure 2:
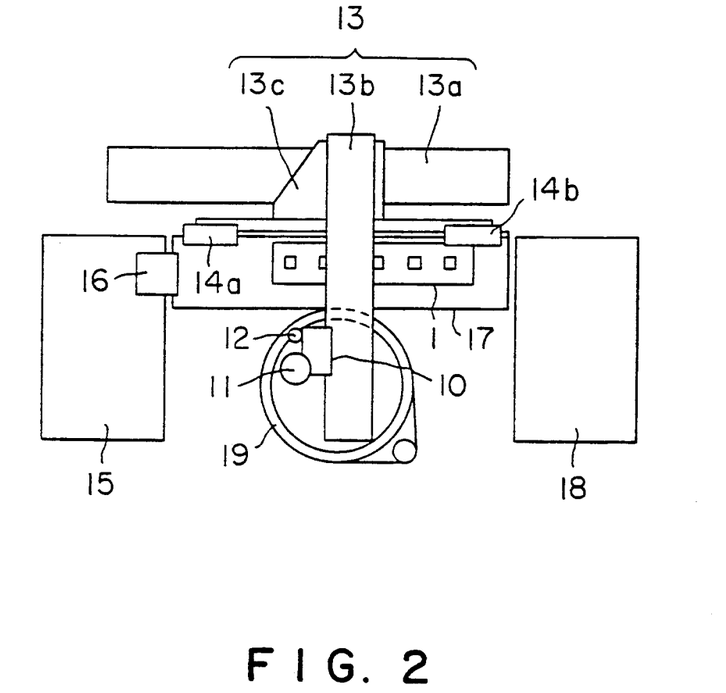
FIG. 2 is a diagrammatical top view showing one embodiment of the die bonding apparatus according to the present invention.

FIG. 2 is a top view showing the embodiment of the die bonding apparatus according to the present invention.

In FIG. 2, a rectangular coordinate robot 13 comprises an X-axis robot 13a and a Y-axis robot 13b. The X-axis robot 13a is linked with two conveying detentes 14a and 14b via a bracket 13c. Further, the Y-axis robot 13b is provided with a bonding head 10. The bonding head 10 is provided with a mechanism for moving a collet 12 up and down, and a camera 11.

On the other hand, a lead frame loader 15 accommodates a semiconductor lead frame 1 to which a die is to be bonded. A paste applying unit 16 is provided to apply a paste onto the upper surface of the lead frame 1 let out from the lead frame loader 15. A lead frame guide rail 17 is arranged to fix the semiconductor lead frame 1 when the die bonding is being effected. A lead frame unloader 18 is provided to accommodate the semiconductor lead frame 1 after die bonding. Further, semiconductor dies 2 to be die bonded are mounted on a wafering station 19.

Figure 3:
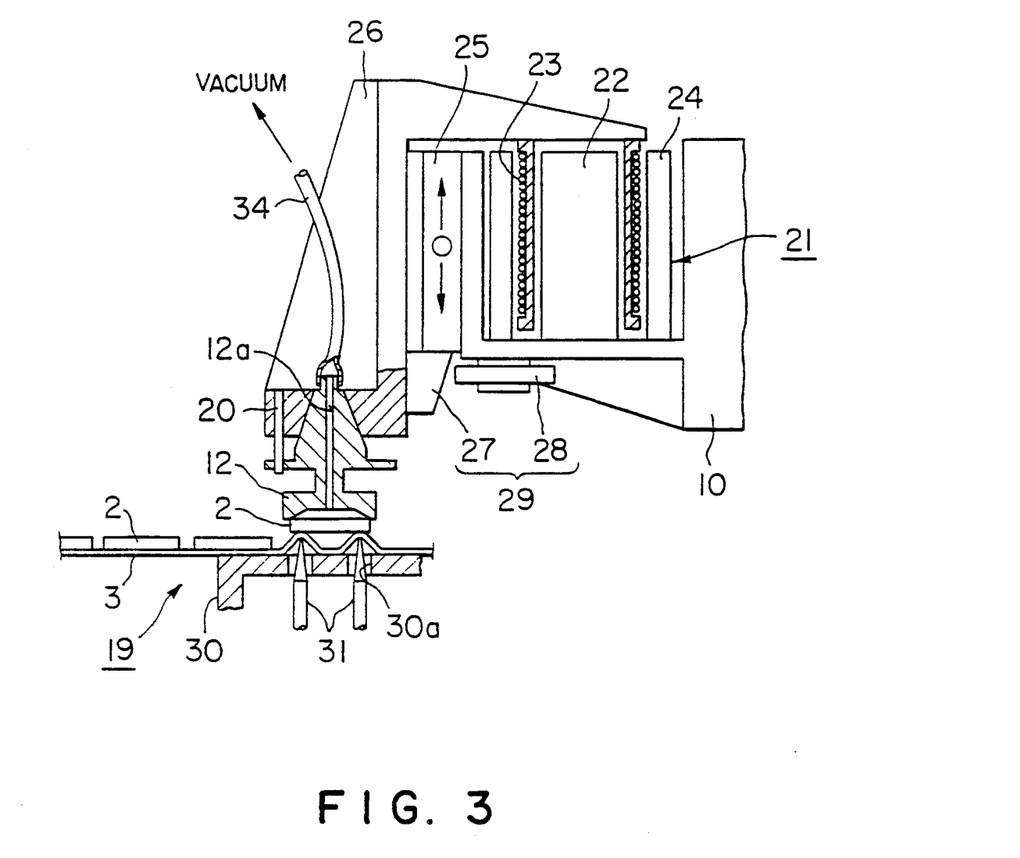
FIG. 3 is an enlarged cross-sectional side view showing the essential portion of the die bonding apparatus shown in FIG. 2.

FIG. 3 is an enlarged cross-sectional side view showing the essential portion of the die bonding apparatus, in which the semiconductor die 2 is supported on the lower surface of the collet 12.

In FIG. 3, a bonding head 10 is provided with a voice coil type linear motor 21 (referred to as a linear motor, hereinafter). The linear motor 21 is composed of a magnet 22 disposed at the central portion of the linear motor 21, a voice coil 23 arranged so at to surround the outer circumferential surface of the magnet 22, an another magnet 24 arranged so as to further surround the outer circumferential surface of the voice coil 23. In the construction as described above, it is possible to move a collet head 26 up and down by controlling the current passed through the voice coil 23 fixed to the collet head 26 relative to the two magnets 22 and 24 both fixed to the bonding head 10.

Further, the collet head 26 is movably supported by a linear guide bearing 25. A collet 12 is attached to the lower end of the collet head 26. In the construction as described above, when the collet head 26 is moved up and down, the collet 12 can be moved also up and down. Further, the angular position of the collet 12 is determined by a whirl-stop pin 20.

Further, a target member 27 is disposed on the side surface of the collet head 26, and a sensor 28 is attached on the bottom surface of the voice coil type linear motor 21. The target member 27 and the sensor 28 constitute a position sensor 29. In this position sensor 29, the target member 27 is formed with a surface facing the sensor 28 and inclined at a predetermined gradient. Therefore, when the collet head 26 is moves up and down, since the distance L between the target member 27 and the sensor 28 changes, it is possible to detect the vertical position of the collet head 26 by measuring the distance L between the target member 27 and the sensor 28; in other words, the height position of the collet 12 can be detected.

The collet 12 is formed with a through hole 12a passing through the collet 12 from the lower surface to the upper surface thereof, and a pipe 34 is inserted into the through hole 12a. Further, a vacuum equipment (not shown) is connected to this pipe 34. In this construction, therefore, when the through hole 12a is evacuated under the condition that the lower surface of the collet 12 is in contact with the semiconductor die 12, it is possible to support the semiconductor die 2 by the collet 12. The semiconductor dies 2 are arranged on a backup member 30 supported by the wafering station 19 via a sheet 3. Further, the back up member 30 is formed with a plurality of through holes 30a. Push-up needles 31 are inserted into these through holes 30a, respectively, so as to be movable up and down through the through holes 30a by driving means (not shown) controlled by a control section (described later). These push-up needles 31 serve to easily remove the semiconductor die 2 away from the sheet 3, when the sheet 3 is pushed up by the top ends of the needles 31 as shown in FIG. 3.

Figure 4:
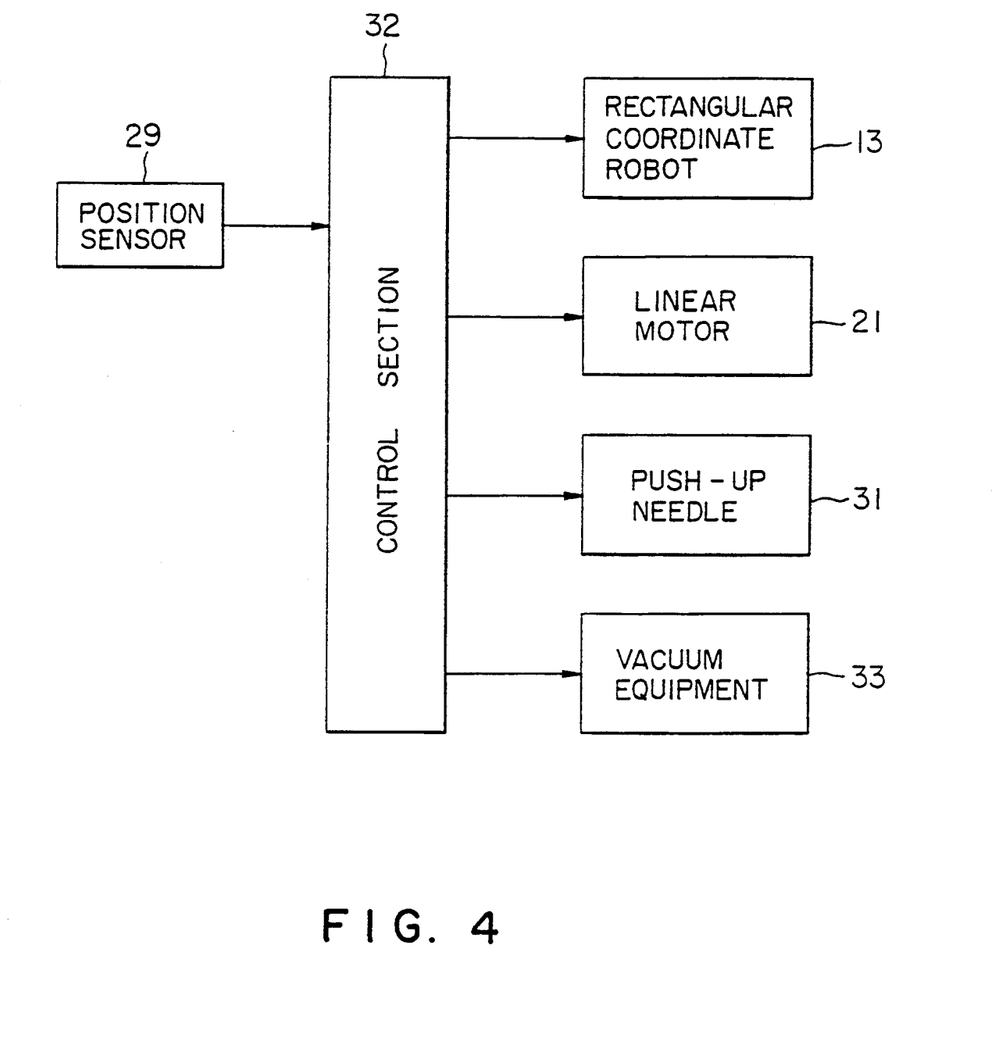
FIG. 4 is a block diagram showing a control circuit of the die bonding apparatus shown in FIG. 2.

FIG. 4 is a block diagram showing a control circuit of the die bonding apparatus of the present invention. As shown in FIG. 4, the rectangular coordinate robot 13, the linear motor 21, the push-up needles 31 and a vacuum equipment 33 are all controlled by a control section 32, respectively. Further, the control section 32 can discriminate the vertical position of the collet 12 on the basis of sensor signals outputted by the position sensor 29.

The method of controlling the linear motor 21 to move the collet 12 up and down by this control section 32 will be described hereinbelow.

The case where the collet 12 can be controlled so as to be moved up and down in accordance with uniform motion will be described with reference to FIGS. 5(a) to (c), in which (a) indicates the relationship between the time t and the vertical position (stroke) z of the collet 12; (b) indicates the relationship between the time t and the velocity v thereof; and (c) indicates the relationship between the time t and the acceleration a thereof. In this case, the collet 12 is controlled in such a way that the velocity v thereof is kept constant as shown in FIG. 5(b); that is, the vertical position (stroke) z thereof increases in proportion of the lapse of time t as shown in FIG. 5(a); and therefore the acceleration a thereof is zero as shown in FIG. 5(c).

Figure 5A:
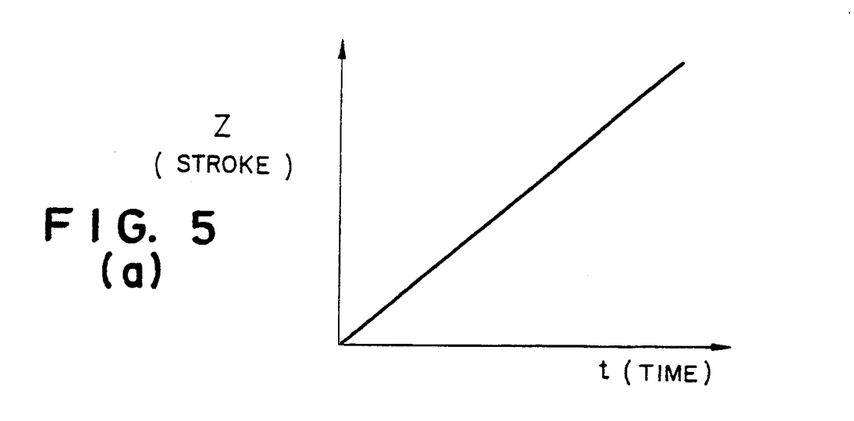
FIGS. 5(a) to (c) are graphical representations for assistance in explaining the method of controlling the vertical movement of the collet shown in FIG. 2 in accordance with uniform motion, in which (a) indicates the relationship between the time t and the vertical position (stroke) z of the collet; (b) indicates the relationship between the time t and the velocity v thereof; and (c) indicates the relationship between the time t and the acceleration a thereof.
Figure 5B:
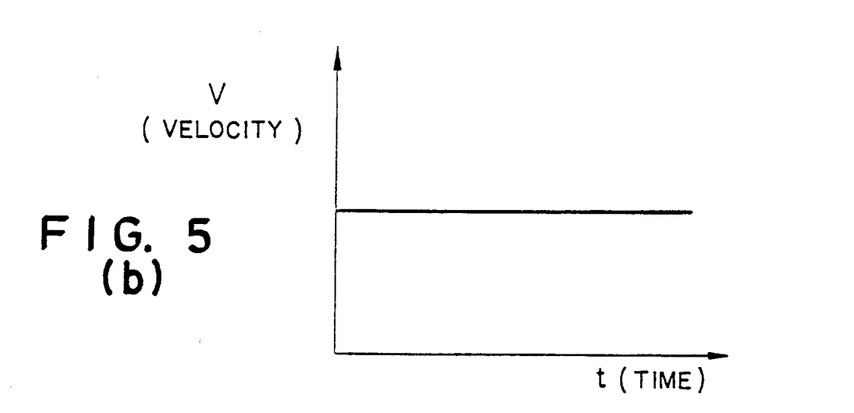
Figure 5C:
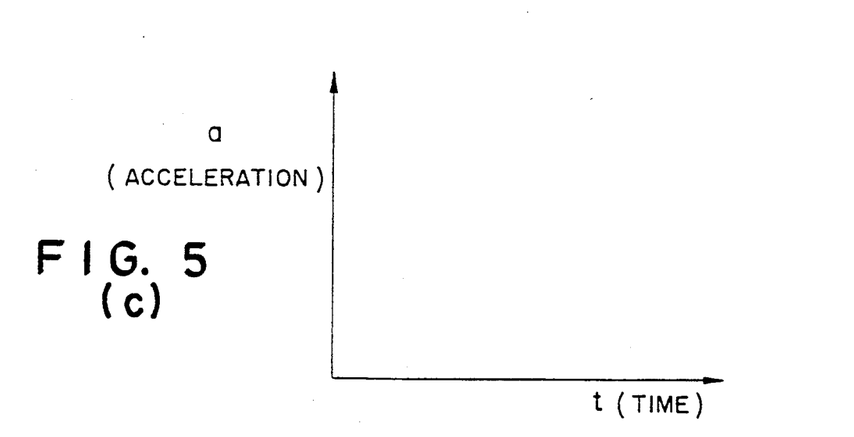

To achieve the above-mentioned control, after the linear motor 21 has been started in accordance with the uniform motion as shown in FIG. 5(a), the vertical positions z (target strokes) of the collet 12 between the upper limit position and the lower limit position are previously stored in a memory unit (not shown) of the control section 32 at predetermined time intervals (e.g., 0.8 msec intervals). Further, when the linear motor 21 is actually being driven, the target position z is read from the memory unit at predetermined time intervals repeatedly as position commands at the corresponding time, and further compared with the actual position data detected by the position sensor 29 to obtain a difference between the two. In this case, if the actual position does not reach the target position, the travel speed of the collet 12 is increased; and if the actual position exceeds the target position, the travel speed of the collet 12 is decreased, both to reduce the difference in position between the target value and the actual value.

The speed increase rate and the speed decrease rate are both determined basically according to the difference between the two. In this embodiment, however, the upper limit of the speed increase rate is determined, as described later. That is, when the collet 12 is brought into contact with the die 2 or when the die 2 sucked by the collet 12 is brought into contact with the semiconductor lead frame 1, the travel speed of the collet 12 is so controlled as not to exceed a predetermined value even if the difference between the two is large.

The case where the collet 12 can be controlled so as to be moved up and down in accordance with uniformly accelerated and decelerated motion will be described with reference to FIGS. 6(a) to (c), in which (a) indicates the relationship between the time t and the vertical position (stroke) z of the collet 12; (b) indicates the relationship between the time t and the velocity v thereof; and (c) indicates the relationship between the time t and the acceleration a thereof. In this case, the collet 12 is controlled as follows: when the acceleration a thereof is kept at a positive constant value $a_1$ as shown in FIG. 6(c), the velocity v is increased in proportion to the time t as shown in FIG. 6(b). Further, when the acceleration a thereof is kept at a negative constant value $a_2$ as shown in FIG. 6(c), the velocity v is decreased in proportion to the time t as shown in FIG. 6(b). Therefore, the height position z of the collet 12 changes according to the time t as shown in FIG. 6(a).

Figures 6A, 6B, 6C:
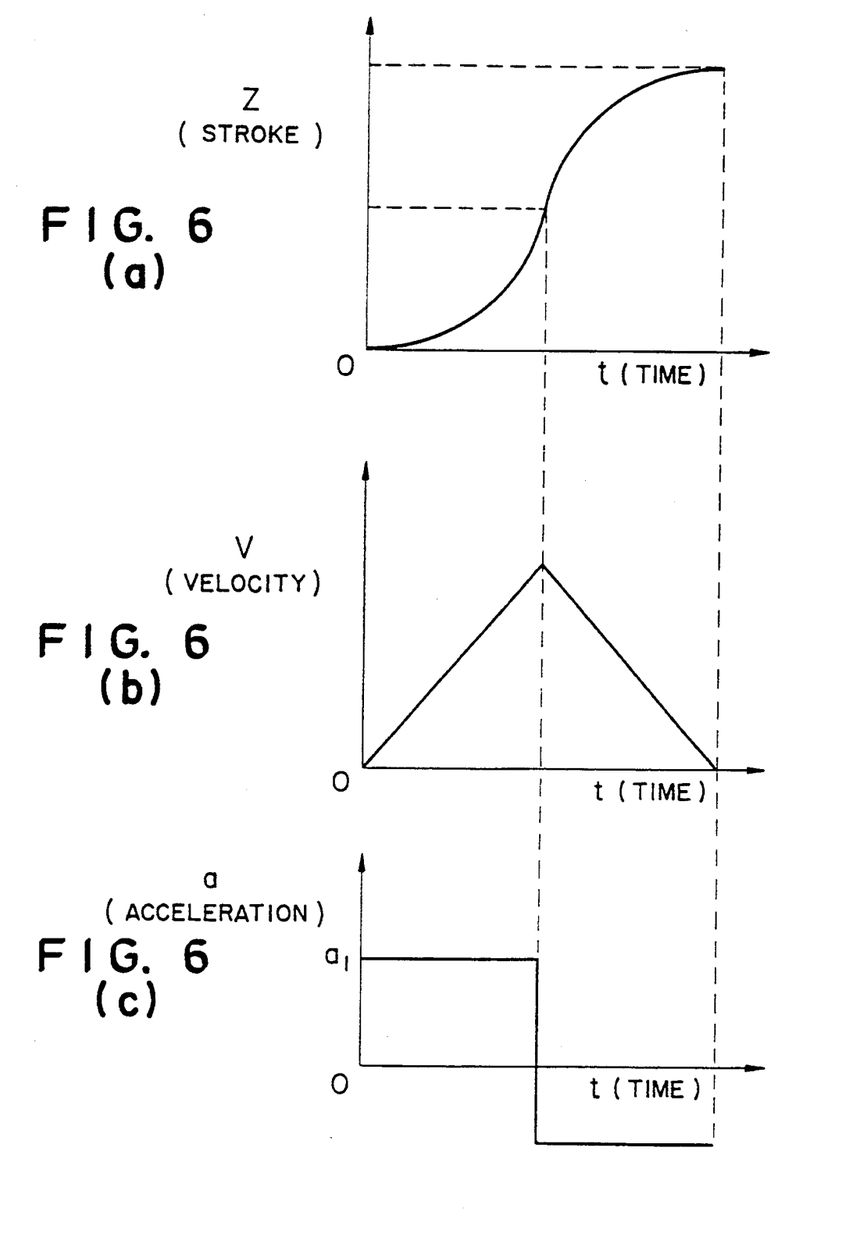
FIGS. 6(a) to (c) are graphical representations for assistance in explaining the method of controlling the vertical movement of the collet shown in FIG. 2 in accordance with uniformly accelerated motion, in which (a) indicates the relationship between the time t and the vertical position (stroke) z of the collet; (b) indicates the relationship between the time t and the velocity v thereof; and (c) indicates the relationship between the time t and the acceleration a thereof.

To achieve the above-mentioned control, after the linear motor 21 has been started in accordance with the uniformly accelerated and decelerated motion as shown in FIG. 6(a), the vertical positions z (target strokes) of the collet 12 between the upper limit position and the lower limit position are previously stored in a memory unit (not shown) of the control section 32 at predetermined time intervals (e.g., 0.8 msec intervals). Further, when the linear motor 21 is actually being driven, the target position z is read from the memory unit at predetermined time intervals repeatedly as position commands at the corresponding time, and further compared with the actual position data detected by the position sensor 29 to obtain a difference between the two, in the same way as with the case of the uniform motion. In this case, if the actual position does not reach the target position, the acceleration (e.g., speed) of the collet 12 is increased, and if the actual position exceeds the target position, the acceleration or deceleration (e.g., speed) of the collet is decreased to reduce the difference in position between the target value and the actual value.

The acceleration increase rate and the acceleration decrease rate are both determined basically according to the difference between the two. In this embodiment, however, an upper limit of the speed increase rate is determined, as described later. That is, when the collet 12 is brought into contact with the die 2 or when the die 2 sucked by the collet 12 is brought into contact with the semiconductor lead frame 1, the upper acceleration limit is so controlled as not to exceed a predetermined value even if the difference between the two is large.

The method of measuring the height positions of the semiconductor lead frame 1 and the semiconductor die 2 by moving the collet 12 up and down will be described hereinbelow.

The height position of the semiconductor lead frame 1 is calculated on the basis of the height position of the collet 12 obtained when the collet 12 is lowered into contact with the semiconductor lead frame 1. Here, it is possible to discriminate whether the collet 12 is in contact with the semiconductor lead frame 1 or not on the basis of the above-mentioned "difference". In more detail, when an increase rate of the difference within a predetermined time period exceeds a constant value (i.e., the target value read out of a table of the memory unit exceeds the actual position of the collet 12 corresponding to the semiconductor lead frame 1), control discriminates that the collet 12 cannot be lowered and therefore brought into contact with the semiconductor lead frame 1. The work of detecting whether the collet 12 is brought into contact with the semiconductor lead frame 1 is referred to as "surface detection", hereinafter.

This surface detection will be described in more practical way with reference to FIG. 7. When the collet 12 is lowered in accordance with the uniform motion as shown in FIGS. 5(a) to (c), an average position value at measuring time $t_n$ is detected by the position sensor 29 on the basis of the position values at the measuring time $t_n$ and other measuring times $t_{n-1}$ and $t_{n+1}$ before and after the measuring time $t_n$. Further, another average position value at measuring time $t_m$ is detected by the position sensor 29 on the basis of the position values at the measuring time $t_m$ and other measuring times $t_{m-1}$ and $t_{m+1}$ before and after the measuring time $t_m$ (which is before the measuring time $t_n$). Further, a difference $L_1$ between the two averaged position values is calculated. On the other hand, an average target position value at measuring times $t_n$, $t_{n-1}$ and $t_{n+1}$ is calculated on the basis of the target position values read out of the memory table. Further, an average target position value at measuring times $t_m$, $t_{m-1}$ and $t_{m+1}$ is calculated on the basis of the target position values read out of the memory table. Further, the difference $L_2$ between the two averaged target position values is calculated. Here, if $L_1/L_2$ is less than a predetermined value (e.g., 3 to 10%), it is discriminated that the collet 12 is brought into contact with the semiconductor lead frame 1. Further, the above-mentioned upper limit value of 3 to 10% is determined under due consideration of the output error of the position sensor 29 caused by electrical and mechanical noise.

As described above, since the upper limit value is set to the velocity and the thrust of the collet 12 controlled by the control section 32 respectively, even if the difference between the actual value and the target value is large, the collet speed can be limited below a predetermined value. Accordingly, when the collet 12 is brought into contact with the semiconductor lead frame 1 and therefore the difference between the actual value and target value increases greatly, it is possible to prevent the semiconductor lead frame 1 from being damaged by an excessively large thrust applied from the collet 12 to the lead frame 1. Alternately, it is also possible to allow the control section 32 to output an alarm signal and further stop the linear motor 21 in case the difference between the two increases excessively.

The operation of the die bonding apparatus according to the present invention will be described hereinbelow with reference to FIGS. 8(a) to (d).

Figure 8A:
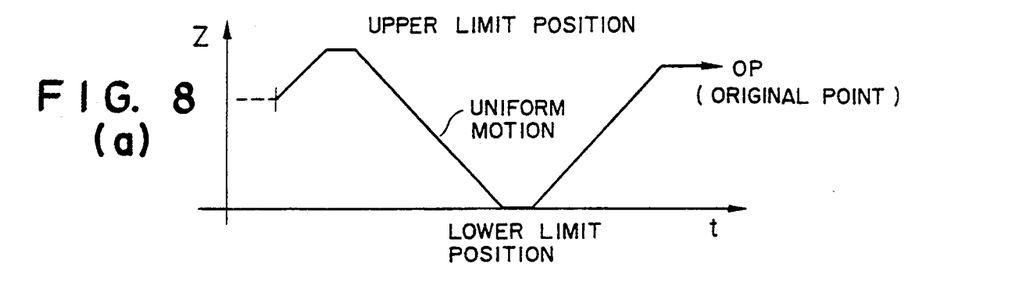
FIGS. 8(a) to (d) are graphical representations for assistance in explaining the method of controlling the die bonding apparatus shown in FIG. 2.

First, as shown in FIG. 8(a), before starting the die bonding operation, the collet 12 is first moved to the upper limit position and then to the lower limit position in accordance with the uniform motion as described with reference to FIG. 5. By this motion, the relationship between the electric output of the position sensor 29 and the mechanical stroke of the collet 12 can be calibrated and further the starting point (the origin of the coordinates) can be decided.

Figure 7:
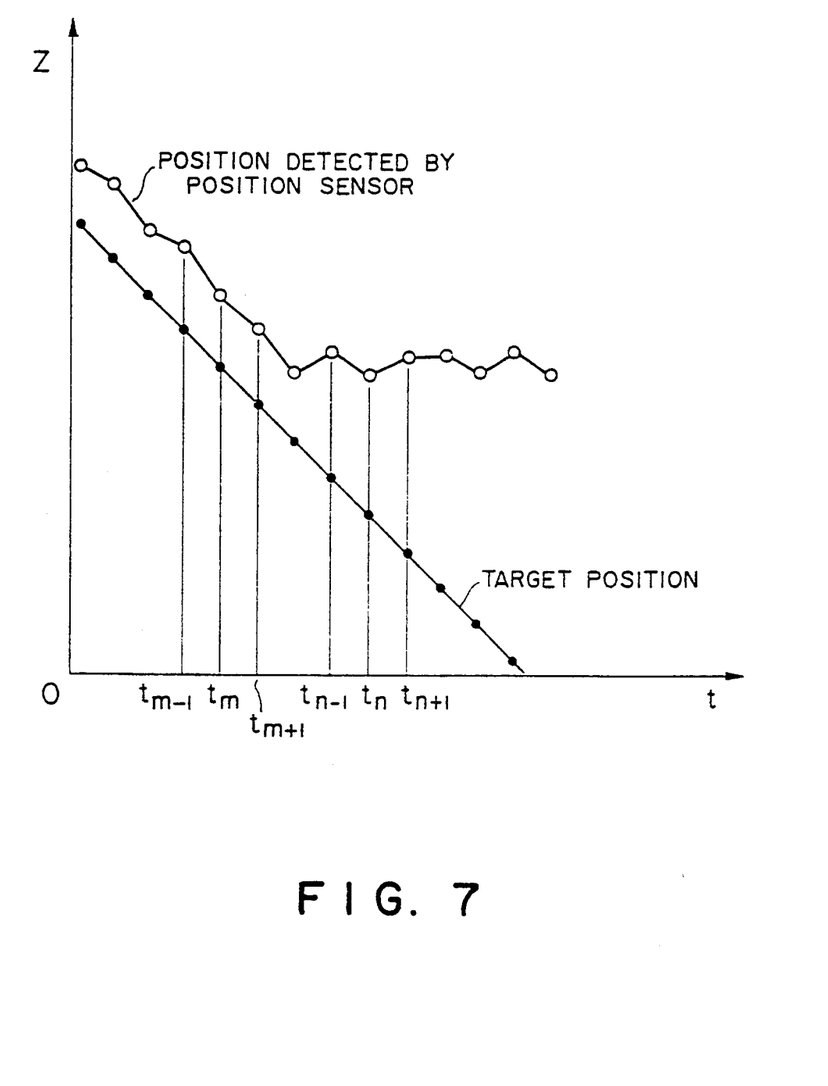
FIG. 7 is a graphical representation for assistance in explaining a practical method of detecting a surface of the die bonding apparatus shown in FIG. 2.
Figure 8B:
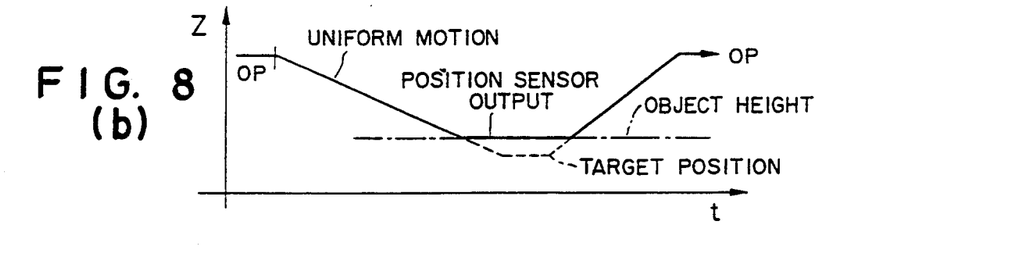

Thereafter, as shown in FIG. 8(b), the collet 12 is moved downward to an object with the use of the rectangular coordinate robot 13; that is, the collet 12 is lowered from the original point in accordance with the uniform motion. Further, the control section 32 executes the surface detection in accordance with the method as described with reference to FIG. 7, in order to measure the various height positions as follows: (1) the height position of the semiconductor lead frame 1; (2) height position of the semiconductor die 2; (3) the height position of the push-up needles 31; (4) the height position of the semiconductor die 2 pushed up by the push-up needles; (5) the height position of the back-up member 30; (6) the height position of the newly exchanged collet 12; etc. Here, the respective heights of these objects are calculated by the control section 32 on the basis of the sensor signals (each obtained for the surface detection) of the position sensor 29. These measured and calculated results are all stored in the memory unit (not shown) of the control section 32.

On the basis of the above-mentioned measurement, it is possible to set the parameters of the semiconductor lead frame 1, the semiconductor die 2, etc. In this case, it is possible to check the extent of wear of the respective members 30, 31, 12, etc. by comparing the current measured results with the past measured results stored in the memory unit, thus enabling the self-diagnosis of the die bonding apparatus before operation. Further, it is also possible to display the results of the self-diagnosis on any required display unit. As the result of self-diagnosis, in case the die bonding apparatus is abnormal, it is also preferable to output an abnormal signal from the control section 32 to the display unit to inform the user of its abnormality.

The actual die bonding can be executed as follows:

(1) First, a semiconductor lead frame 1 is let out from the lead frame loader 15, and a paste is applied onto the surface thereof with the paste applying unit 16. Thereafter, the lead frame 1 is conveyed to a predetermined position along the lead frame guide rail 17 with the use of the conveying detentes 14a and 14b.

Figure 8C:
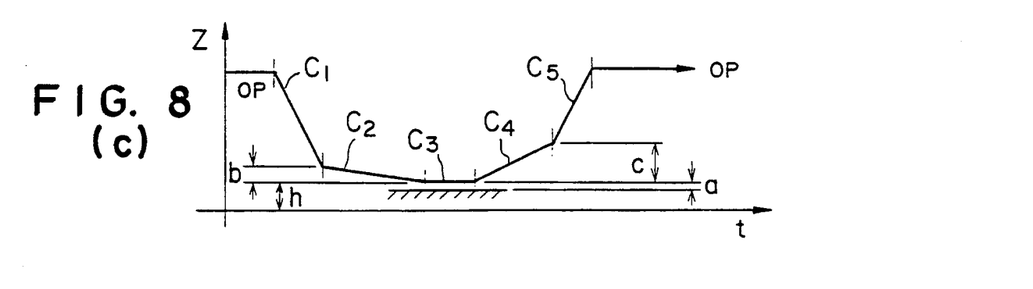

(2) The Y-axis robot 13b is driven to move the semiconductor die 2 mounted on the wafering station 19 over the collet 12, and then the linear motor 21 is driven to move the collet 12 downward to a position a distance b higher than the height position h of the semiconductor die 2 in accordance with the uniformly accelerated and decelerated motion (as described with reference to FIG. 6) as shown by $C_1$ in FIG. 8(c). Further, the collet 12 is moved downward to the position a distance a higher than the height position h of the semiconductor die 2 in accordance with the uniform motion (as described with reference to FIG. 5) as shown by $C_2$ in FIG. 8(c). Further, the collet 12 is kept at this height position for a time period as shown by $C_3$ in FIG. 8(c).

(3) Successively, the push-up needles 31 (arranged under the semiconductor die 2) and the collet 12 are moved upward simultaneously by a distance c in accordance with the uniform motion as shown by $C_4$ in FIG. 8(c). Further, the vacuum equipment (not shown) connected to the pipe 34 is actuated to evacuate the pipe 34, with the result that the semiconductor die 2 pushed up by the push-up needles 31 is sucked by the collet 12 securely.

Here, in case the upward travel speed of the push-up needles 31 is higher than that of the collet 12, the push-up needles 31 collide against the collet 12, so that the upward travel speed of the collet 12 exceeds a predetermined set value. In this case, since the difference between the actual position and the target position of the collet 12 increases, there exists a problem in that the control section 32 decreases the upward travel speed of the collet 12 and thereby an excessive pressure is applied between the collet 12 and the push-up needles 31, with the result that the semiconductor die 2 is damaged. In this embodiment, however, whenever the collet 12 and the push-up needles 31 are moved simultaneously in the upward direction, the upward travel speed of the collet 15 will not be decreased below a predetermined value even if the actual position of the collet 12 is higher than the target position, thus solving the above-mentioned problem.

(4) Thereafter, the collet 12 is moved upward to the original point in accordance with the uniformly accelerated and decelerated motion as shown by $C_5$ in FIG. 7(c).

(5) After the collet 12 has reached the original point, the linear motor 21 is stopped, and the Y-axis motor 13b is driven to move the collet 12 which holds the semiconductor die 2 over the semiconductor lead frame 1.

Figure 8D:
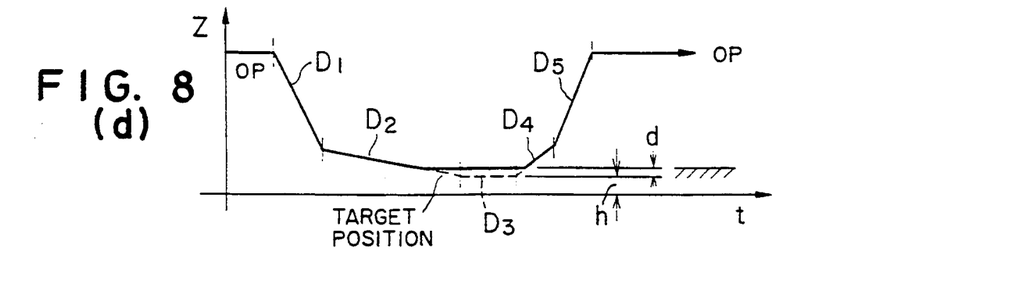

(6) Successively, the linear motor 21 is driven to move the collet 12 downward to a predetermined position in accordance with the uniformly decelerated and decelerated motion (as described with reference to FIG. 5) as shown by $D_1$ in FIG. 8(d). In this case, the predetermined height is so determined and calculated on the basis of the height positions of the semiconductor lead frame 1 and the semiconductor die 2 in such a way that the lower surface of the semiconductor die 2 will not be brought into contact with the upper surface of the semiconductor lead frame 1.

(7) The linear motor 21 is further driven to move the collet 12 downward in accordance with the uniform motion (as described with reference to FIG. 5) as shown by $D_2$ in FIG. 8(d) for surface detection (as described with reference to FIG. 7). In this case, when the difference between the actual and target positions of the collet 12 exceeds a predetermined value, the surface detection is discriminated. Here, the difference d between the height of the lower surface of the semiconductor die 2 (of when the surface detection is made) and the height of the semiconductor lead frame 1 corresponds to the thickness of the paste. In case this thickness is large or small excessively, the control section 32 outputs an abnormal signal indicative of that the paste application is abnormal.

(8) Thereafter, pressure is applied between the semiconductor die 2 and the semiconductor lead frame 1 for die bonding as shown by $D_3$ in FIG. 8(d). In this case, the pressure (i.e., the thrust the linear motor 21) is determined according to the kinds, sizes, etc. of the semiconductor lead frame 1 and the semiconductor die 2.

In accordance with the above-mentioned procedure, the paste between the semiconductor lead frame 1 and the semiconductor die 2 is smoothed out thin so as to facilitate die bonding between the two.

In addition, during this pressurization for die bonding, it is possible to check the bonding condition between the two on the basis of the difference between the actual and target positions of the collet 12. In other words, it is possible to monitor whether the paste has been smoothed out appropriately, by checking the change in height position detected by the position sensor 29.

(9) Thereafter, the suction of the semiconductor die 2 by the collet 2 is released, and the linear motor 21 is driven to move the collet 21 upward in accordance with the uniform motion (as described with reference to FIG. 5) as shown by $D_4$ in FIG. 8(d). In this case, even if the difference between the actual and target positions of the collet 12 is large, the control section 32 controls that the speed is not increased beyond a predetermined value.

(10) When the collet 12 is moved upward away from the upper surface of the semiconductor die 2 by a predetermined distance, the collet 12 is moved upward to the original point in accordance with the uniformly accelerated and decelerated motion as shown by $D_5$ in FIG. 8(d).

(11) With respect to the other remaining bonding surfaces of the semiconductor lead frame 1, the die bonding is effected in the same procedure as described by the items (2) to (9) above. Upon completion of die bonding for all the bonding surfaces, the semiconductor lead frame 1 is accommodated into the lead frame unloader 18 with the use of the conveying detentes 14a and 14b.

As described above, in the die bonding apparatus of the present invention, since the collet 12 is moved up and down by the linear motor 21 in accordance with the uniform motion or the uniformly accelerated or decelerated motion, and further since the height position of the collet 12 is directly detected by the position sensor 29, it is possible to control the die bonding pressure of the collet 12 by directly controlling the linear motor 21 for driving the collet 12 up and down, without interposing any spring between the collet 12 and the semiconductor die 2 as with the case of the conventional apparatus shown in FIG. 1.

Therefore, it is possible to reduce the setting error of the bonding pressure, measure the paste thickness used for die bonding accurately, and further check the bonding condition between the semiconductor lead frame 1 and the semiconductor die 2, with the result that the production yield of the semiconductor device can be improved.

In addition, in the die bonding apparatus of the present invention, since the self-diagnosis can be executed, the production yield of the semiconductor device can be further improved.

Further, since the mechanisms 55 to 59 as shown in FIG. 1 for applying a bonding pressure so far required for the conventional apparatus are all unnecessary, the die bonding apparatus can be simplified in mechanism and reduced in weight, volume and further manufacturing cost.

Further, since the weight applied to the bonding head is small, it is possible to move the collet 12 (which holds the semiconductor die 2) over the semiconductor lead frame 1 quickly, so that the processing capacity (the number of semiconductor dies bonded for each unit time) can be increased.

Further, since the weight of the apparatus is small, the collet 12 cannot be moved up and down excessively or vibrated, so that it is possible to prevent an excessive shock from being applied to the collet 12 when the semiconductor die 2 is sucked by the collet 12 or when the semiconductor die 2 sucked by the collet 12 is brought into contact with the semiconductor lead frame 1, thus protecting the semiconductor die 2 from being damaged.

As described above, in the die bonding apparatus according to the present invention, it is possible to provide a die bonding apparatus high in reliability, simply in mechanism, small in weight and volume, and low in cost.

What is claimed is:

1. A die bonding apparatus for bonding a die onto a bonding surface of a lead frame by pressing the die under a constant pressure, which comprises:
   mounting means for mounting the die;
   a collet having chucking means for holding the die mounted on said die mounting means;

a linear motor for moving said collet up and down;

separating means for separating the die from said die mounting means when the die mounted on said mounting means is held by said chucking means;

horizontal driving means for moving said collet horizontally;

lead frame mounting means for mounting the lead frame;

a position sensor for detecting vertical positions of said collet; and linear motor control means for controlling vertical travel speed of said collet and bonding pressure of the die against the bonding surface of the lead frame, by controllably driving said linear motor on the basis of position information of said collet detected by said position sensor.

2. The die bonding apparatus of claim 1, wherein said linear motor control means comprises reference information storing means for storing any one of reference position and reference travel speed of said collet for each predetermined time, and said linear motor control means controls the travel speed of said collet so that a difference between the reference position or the reference travel speed read out of said reference information storing means and an actual position or an actual travel speed determined on the basis of position information detected by said position sensor can be reduced.

3. The die bonding apparatus of claim 2, wherein said linear motor control means controls the travel speed or thrust of the collet so as not to exceed an upper limit, when said collet is moved up and down to bring said chuck means into contact with the die or when said collet is moved downward to bring the die held by said chucking means into contact with the lead frame and further when the difference between the reference position or the reference travel speed and an actual position or an actual travel speed is not zero.

4. The die bonding apparatus of claim 2, wherein said linear motor control means controls the travel speed of said collet so as not to be reduced, when the die is held by said chucking means by moving upward said collet and said separating means simultaneously and further when said chucking means is brought into contact with said separating means so that the difference between the reference position or the reference travel speed and an actual position or an actual travel speed is not zero.

5. The die bonding apparatus of claim 2, wherein said linear motor control means stops said linear motor, in the case where the difference between the reference position or the reference travel speed and an actual position or an actual travel speed exceeds a predetermined value when said collet is moved downward to bring said chucking means into contact with the die and thereby a contact between said chucking means and the die is sensed.

6. The die bonding apparatus of claim 2, wherein said linear motor control means controls said linear motor movement so that the bonding surface of the lead frame is pressed against the die under a predetermined pressure, in the case where the difference between the reference position or the reference travel speed and an actual position or an actual travel speed exceeds a predetermined value when said collet is moved downward to bring the die held by said chucking means into contact with the lead frame and thereby a contact between the die and the lead frame is sensed.

7. The die bonding apparatus of claim 5, wherein said linear motor control means comprises height information storing means for storing position information of said collet as height information in the case where the difference between the reference position or the reference travel speed and an actual position or an actual travel speed exceeds a predetermined value when said collet is moved downward.

8. The die bonding apparatus of claim 7, wherein said linear motor control means compares position information of said collet detected by said position sensor with position information read out of said height information storing means when the contact is sensed, and outputs an abnormal signal when a difference between the two exceeds a predetermined value.

9. The die bonding apparatus of claim 1, wherein said linear motor control means compares position information detected by said position sensor with previously determined reference information of said chucking means when said chucking means of said collet is brought into contact with a predetermined contact object, and outputs self-diagnosis information on the basis of whether the difference between the two exceeds a predetermined allowable value.

10. The die bonding apparatus of claim 9, wherein said linear motor control means comprises storing means for storing position information detected by said position sensor as reference chucking-means dimension information, when said chucking means of said collet is brought into contact with the predetermined contact object.

* * * * *